United States Patent [19]

Müller et al.

[11] 4,058,731
[45] Nov. 15, 1977

[54] SPECIMEN HOLDER FOR A CORPUSCULAR-BEAM APPARATUS

[75] Inventors: Karl-Heinz Müller; Walter Munchmeyer; Moriz von Rauch; Norbert Schafer, all of Berlin, Germany

[73] Assignee: Siemens Aktiengesellschaft, Berlin and Munich, Germany

[21] Appl. No.: 721,692

[22] Filed: Sept. 9, 1976

[30] Foreign Application Priority Data

Sept. 19, 1975 Germany .............................. 2542360

[51] Int. Cl.² .............................................. G21K 5/06
[52] U.S. Cl. ..................................... 250/442; 250/440
[58] Field of Search ................ 250/311, 441, 442, 440

[56] References Cited

U.S. PATENT DOCUMENTS

| | | | |
|---|---|---|---|
| 3,648,048 | 3/1972 | Cahan et al. | 250/442 |
| 3,678,270 | 7/1972 | Braun et al. | 250/442 |
| 3,745,341 | 7/1973 | Sakitani | 250/442 |
| 3,952,203 | 4/1976 | Hoppe | 250/442 |

*Primary Examiner*—Craig E. Church
*Assistant Examiner*—B. C. Anderson
*Attorney, Agent, or Firm*—Kenyon & Kenyon, Reilly, Carr & Chapin

[57] ABSTRACT

A corpuscular-beam apparatus including a specimen holder having at least two degrees of freedom of translation and at least one degree of freedom of rotation, and control means for correcting the translational coordinates of the specimen holder automatically when the specimen holder is rotated and retaining a predetermined specimen point in its position in the apparatus. The improvement of the invention comprises the control means comprising means for controlling the rotational movement of the specimen holder stepwise in angular increments, the angular increments being chosen small so that the translational movement of the specimen point for each angular increment may be considered linear. The control means further comprises means for correcting the translational coordinates of the specimen holder stepwise in linear increments prior to each stepwise rotation of the specimen holder, each of the linear increments comprising a linear function of the instantaneous values of the translational coordinates and of the angular increments of the rotational movement of the specimen holder.

6 Claims, 9 Drawing Figures

SPECIMEN HOLDER FOR A CORPUSCULAR-BEAM APPARATUS

BACKGROUND OF THE INVENTION

1. Field of the Invention

The present invention relates to a corpuscular-beam apparatus including a specimen holder which has at least two degrees of freedom of translation and at least one degree of freedom of rotation, and a control means which corrects the translational coordinates of the specimen holder when the specimen holder is rotated so that a predetermined specimen point retains its position in the apparatus. (Rotation of a specimen point means, in the context of the present invention, a turning, i.e., a circular motion or rotation about an axis disposed perpendicular to the plane of the specimen, as well as tilting, i.e., a circular motion or rotation about an axis in the specimen.)

2. Description of the Prior Art

A corpuscular-beam apparatus of the above-described type may comprise an electron microscope. See, for example, U.S. Pat. No. 3,727,051. In such a microscope, the specimen holder comprises a goniometer, in particular a double-tilt goniometer, in which the specimen is suspended in gimbals in a frame which is movable in a plane disposed perpendicular to the electron beam of the microscope and has two tilt axes. The first of the two axes extends in the direction of one translational coordinate axis. The second axis is disposed perpendicular to the first axis and is rotatable about that axis. The described goniometer permits a specimen to be moved with four degrees of freedom. The fifth degree of freedom, corresponding to the third translational coordinate (in the direction of the optical axis of the microscope), is simulated by changing the focal length of the objective lens.

Such electron microscopes also include a control unit including a computer into which the instantaneous values of the translational coordinates and the tilt angle are entered. The computer calculates the corrections of the specimen position required in the event of a tilt, controls the translational drives, and changes the focal length of the objective lens of the microscope as required. The corrections are exact calculations which require considerable computation. Thus, it is necessary, for example, to generate electric voltage signals which are proportional to a product of four trigonometric functions of the specimen tilt angles.

Aside from the double-tilt goniometer described above, there are also tilt-rotation goniometers, such as that described in French Pat. No. 2,102,553, which are known in the art. In these specimen holders, the specimen is supported on a rotary table which is held in a frame movable in a plane perpendicular to the microscope beam and which is tiltable about an axis extending in the direction of one coordinate axis. If control of the correction of the translational coordinates is desired in such a goniometer in the event of a rotation of the specimen holder in the exact manner described, it is necessary to again calculate products of trigonometric functions. The effort required to do this is obviously excessive.

SUMMARY OF THE INVENTION

It is therefore an object of the present invention to provide an improved goniometer for a corpuscular-beam apparatus which overcomes the above-described disadvantages of heretofore known goniometers and simplifies correction of the translational coordinates of the specimen holder of the apparatus.

These and other objects of the invention are achieved in a corpuscular-beam apparatus including a specimen holder having at least two degrees of freedom of translation and at least one degree of freedom of rotation, and a control means for correcting the translational coordinates of the specimen holder automatically when the specimen holder is rotated and retaining a predetermined specimen point in its position in the apparatus. The improvement of the invention comprises the control means comprising means for controlling the rotational movement of the specimen holder stepwise in angular increments, the angular increments being chosen small so that the translational movement of the specimen point for each angular increment may be considered linear. The control means further comprises means for correcting the translational coordinates of the specimen holder stepwise in linear increments prior to each stepwise rotation of the specimen holder, each of the linear increments comprising a linear function of the instantaneous values of the translational coordinates and of the angular increments of the rotational movement of the specimen holder.

In a preferred embodiment of the invention, a servo system is coupled between the control unit and the specimen holder and comprises a setpoint transmitter, a control amplifier coupled to the transmitter, a d-c motor coupled to the amplifier, and an actual-value transducer coupled to the specimen holder and the control amplifier which feeds back the actual coordinates of the specimen holder to the control amplifier. The setpoint transmitter preferably comprises an integrator which stores the desired setpoint coordinates. The servo system enables the specimen to be moved in variable incremental steps and permits very small specimen movements to be effected.

If an integrator comprises the setpoint transmitter, the content of the integrator may change by itself, particularly after long periods of rest, i.e., periods when the specimen is not being moved, since the integrator includes a storage device, for example, a capacitor, which may discharge itself over a period of time. This causes a change in the setpoint value which the servo system would transmit to the specimen by effecting a displacement of the specimen. To avoid such a phenomenon, a switch contact is provided between the actual-value transducer and the setpoint transmitter upon the closing of which the content of the setpoint transmitter is fixed or set at the output level or quantity of the actual-value transducer. The switch contact is closed during the rest period when the desired setpoint value is not changed. If the position of the specimen is desired to be changed, the switch is opened and the connection between the setpoint transmitter and the actual-value transducer is interrupted. The servo system then effects displacement of the specimen.

In the corpuscular-beam apparatus of the invention, correction of the translational coordinates of the specimen is controlled in a stepwise manner. If several rotational steps are carried out in succession, for example, such as when traversing a large tilt angle, the rotational step frequency may be higher than the correction step frequency. As a result, the translational coordinates cannot be corrected prior to the next incremental rotational step and the specimen area examined wanders out of the field of view of the apparatus. To prevent this from happening, means are preferably provided which render the control unit inoperative when a predetermined difference between the setpoint value and the actual value is exceeded. The servo system is thereby enabled to set the actual value to the desired value, and only then can the setpoint value again be changed and the desired movement of the specimen be effected.

It is also preferred to choose the incremental step angles as a function of magnification. The correction error which occurs during a rotation of the specimen increases as the step angle, i.e., the angular increments, increase and as the selected magnification increases. The control of the angular step increments is accordingly effected so that the increments become smaller as the magnification increases. The total error for the image projected by the corpuscular-beam apparatus can then be kept approximately constant.

These and other novel features of the invention will be described in greater detail in the following detailed description.

BRIEF DESCRIPTION OF THE DRAWINGS

In the drawings, wherein similar reference numerals denote similar elements throughout the several views thereof.

DETAILED DESCRIPTION

Figures 1A, 1B:
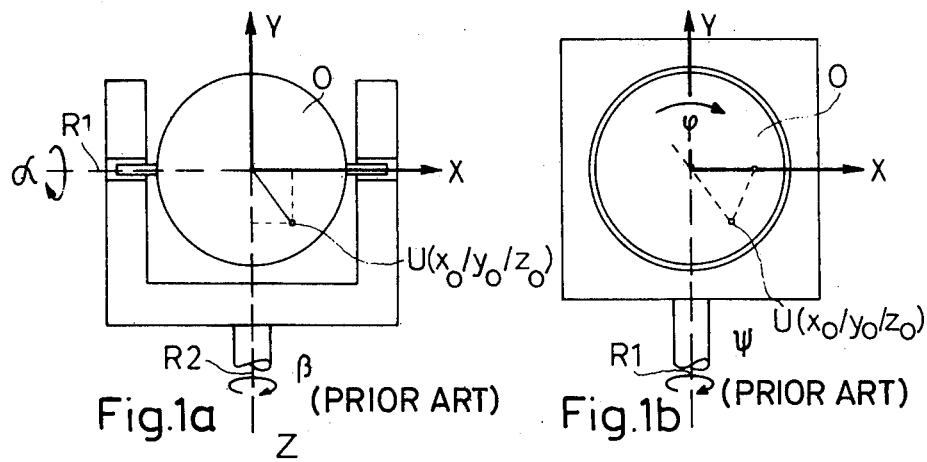
FIG. 1a is a schematic illustration of a prior art double-tilt goniometer for use in an electron microscope.
FIG. 1b is a schematic illustration of a prior art tilt-rotation goniometer for use in an electron microscope.

Referring now the drawings, there is shown, in schematic form in FIGS. 1a and 1b, a double-tilt goniometer and a tilt-rotation goniometer, respectively, for use in an electron microscope. In both goniometers a specimen O is rotatable about two mutually perpendicular axes R1 and R2, one of which, specifically axis R1, is disposed in the specimen plane. The second axis, R2, is disposed perpendicular to axis R1. In the double-tilt goniometer, axis R2 also extends, in an untilted condition, into the specimen plane. The specimen can, thus, be tilted about two axes, the corresponding tilt angles of which are identified in the drawings by the reference characters $\alpha$ and $\beta$. In the tilt-rotation goniometer, the second axis R2 extends in the direction of the surface normal of specimen O which is tiltable through a tilt angle $\psi$ and rotatable through a rotation angle $\phi$.

In order to describe the movements of the specimen, an orthogonal coordinate system including the axes $x$, $y$ and $z$ will be used. These axes are fixed with respect to specimen O and their origin coincides with the point of intersection and the axes of rotation R1 and R2 of the goniometers. In the double-tilt goniometer, the $y$-axis extends in the direction of axis R2 for tilt angle $\beta$, and in the tilt-rotation goniometer, the axis extends in the direction of tilt axis R1 for tilt angle $\psi$. The z-axis is disposed parallel to the direction of the electron beam which illuminates the specimen area to be examined and, in FIGS. 1a and 1b, the axis is disposed perpendicular to the plane of the drawing.

For the purposes of the following discussion, it will be assumed that the center U of the area of the specimen examined has the coordinates $x_o$, $y_o$, $z_o$ within the above-described coordinate system, and that rotation angles $\alpha$ and $\beta$ in the double-tilt goniometer and the rotation angle $\psi$ in the tilt-rotation goniometer, are zero when the specimen O is disposed perpendicular to the direction of the electron beam. It will also be assumed that the coordinate point $x_o$, $y_o$, $z_o$ of the specimen is initially located in the optical axis of the microscope. After rotational movement through a small angle $\Delta\alpha$ or $\Delta\beta$, the coordinate point of the specimen is, generally speaking, no longer located in the optical axis, and, in order to return the point to the field of view of the microscope, the translation coordinates must be corrected. This correction is carried out in linear, incremental step widths $\Delta x_k$, $\Delta y_k$, and $\Delta z_k$ in the $x$, $y$, and $z$-axis directions which are approximately given, for limited tilt angles in the double-tilt goniometer by the following equations:

$$\Delta x_k = -\Delta\alpha \cdot y_o \sin \beta + \Delta\beta \cdot z_o \tag{1}$$

$$\Delta y_k = -\Delta\alpha \cdot y_o \tan \alpha \tag{2}$$

$$\Delta z_k = -\Delta\alpha \cdot y_o \cos \beta - \Delta\beta \cdot x_o \tag{3}$$

The corresponding linear, incremental correction step widths for the translational coordinates for rotation of the specimen through the angles $\Delta\alpha$ and $\Delta\phi$, respectively, are given in the tilt-rotation goniometer by the following equations:

$$\Delta x_k = \Delta\phi \cdot y_o \cdot \cos \psi - \Delta\psi \cdot z_o \tag{4}$$

$$\Delta y_k = -\Delta\phi \cdot (x_o \cos \psi + z_o \sin\psi) \tag{5}$$

$$\Delta z_k = \Delta\phi \cdot y_o \cdot \sin \psi + \Delta\psi \cdot x_o \tag{6}$$

As is evident from the foregoing, neither products nor differences of trigonometric functions are present in the correction step width equations.

If the translational coordinates are corrected stepwise prior to each rotation of the specimen, the correction error is small even when the specimen is rotated through large angles of rotation. (The "correction error" is the difference between the known, exact correction of the translational coordinates and the approximate correction of these coordinates as described herein by approximating a circular motion by a linear motion).

Figure 2:
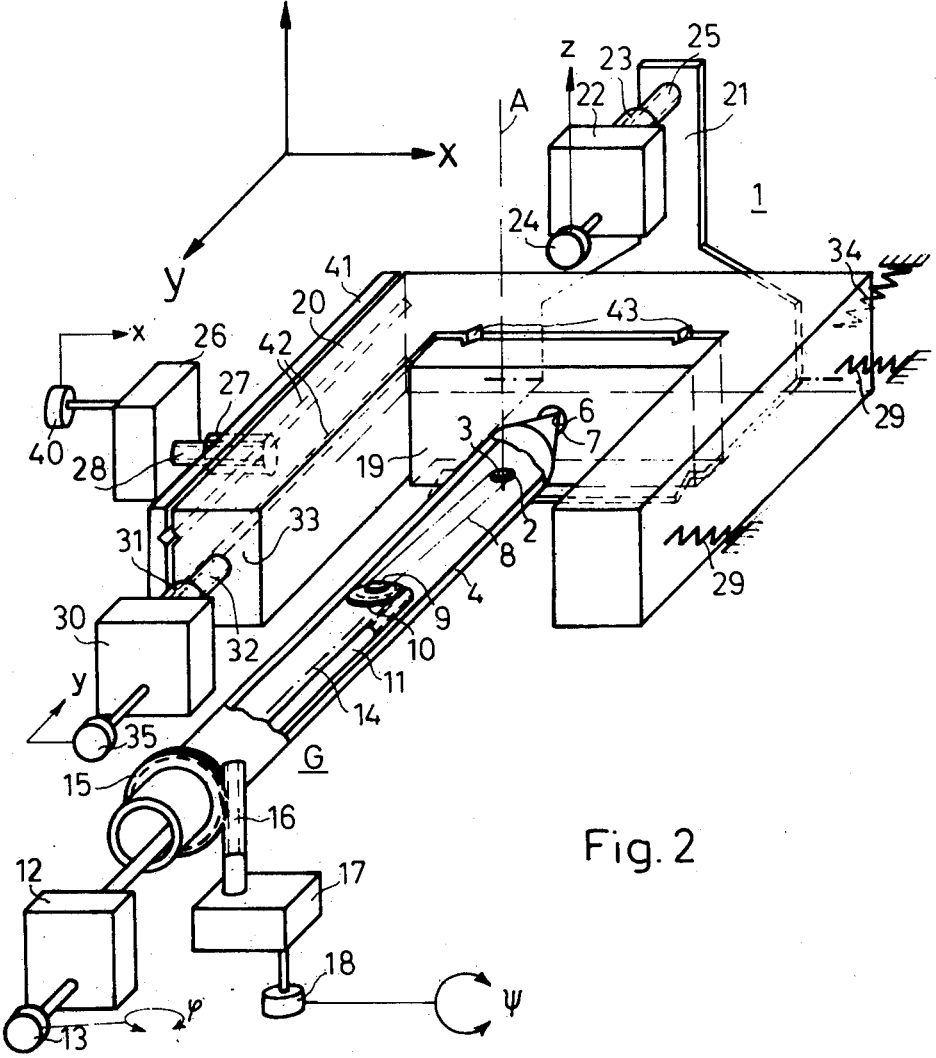
FIG. 2 is a schematic illustration of an improved specimen holder for a corpuscular-beam apparatus constructed according to the present invention.

FIG. 2 is a schematic illustration of a specimen holder designed as a tilt-rotation goniometer for a corpuscular-beam apparatus such as, for example, an electron microscope 1, the electron beam of which travels along an axis A. The goniometer G includes a rod-shaped specimen holder 4 in which a specimen 3 is supported on a turntable 2. Specimen holder 4 is, at the end facing away from the electron beam of the microscope, disposed in a bearing (not shown). Turntable 2 is rotatable about its central axis through an angle of rotation $\phi$ by means of a transmission means 8 comprising an endless metal wire driven by a pulley 9. The pulley has a gear 10 disposed on its lower surface which is driven by a spindle 11. A motor 12 fastened to specimen holder 4 to prevent relative rotation drives spindle 11. The spindle position is given by an electrical signal generated by a rotary potentiometer 13 coupled to the motor which represents the actual value of the angle of rotation $\phi$ of turntable 2 and is transmitted to a control unit illustrated in FIG. 3. Specimen holder 4 is tiltable about its longitudinal axis 14 by means of a gear 15 disposed at the rear end of the holder which meshes with a spindle 16 driven by a motor 17. The position of the spindle is given by an electrical signal generated by another rotary potentiometer 18 which represents the actual value of the tilt angle $\psi$ of the holder and is also transmitted to the control unit illustrated in FIG. 3.

In addition to being tiltable and rotatable, specimen 3 is movable in the x, y and z-axis directions. The y-axis direction extends parallel to the direction of longitudinal axis 14 of specimen holder 4, i.e., the axis of tilt angle $\psi$. The z-axis direction is the direction of axis A of electron microscope 1, and the origin of the stationary, orthogonal coordinate system x, y, z is disposed at the point of intersection of longitudinal axis 14 with the central axis of turntable 2.

The tip 6 of specimen holder 4 is disposed in a bearing 7 mounted in a plate 19 held in a U-shaped frame 20. The plate is movable up and down, i.e., in the z-axis direction by an angle lever 21. In order to achieve this, plate 19 is guided at its rear side in two parallel, longitudinal bearings 43 extending along the z-axis direction. Angle lever 21 is moved by a motor 22 which turns a threaded bushing 23 engaged by a non-rotatable spindle 25 extending in the y-axis direction which engages angle lever 21. A rotary potentiometer 24 is disposed at the end of spindle 25 opposite lever 21 which generates an electrical signal representing the position of spindle 25 and the z-axis coordinate of specimen 3 and transmits the signal to the control unit illustrated in FIG. 3.

The specimen is moved in the x-axis direction, in a manner similar to the z-axis movement, by a motor 26 which turns a spindle 28 engaging a threaded bushing 27. The bushing 27 is rigidly mounted on a plate 41 which rests against a lateral surface of frame 20. Between frame 20 and plate 41 are two longitudinal bearings 42 which extend along the y-axis direction. Frame 20 is accordingly movable in the y-axis direction relative to plate 41. Spindle 28 moves frame 20 against the force of compression springs 29 which are disposed on and engage the side of frame 20 opposite spindle 28.

Specimen 3 is moved in the y-axis direction by a motor 30 which turns a threaded bushing 31 engaging a non-rotatable spindle 32 disposed in engagement with an end face 33 of frame 20. The frame is held in an equilibrium position by springs 34 (only one of two springs is shown in the drawings) disposed on and engaging the side of frame 20 opposite end face 33. The position of spindles 32 and 28 is given by an electrical signal generated by rotary potentiometers 35 and 40 connected to motors 26 and 28. This signal is transmitted as the actual value of the x and y-axis coordinates, respectively, of specimen 3 to the control unit illustrated in FIG. 3.

Figure 3:
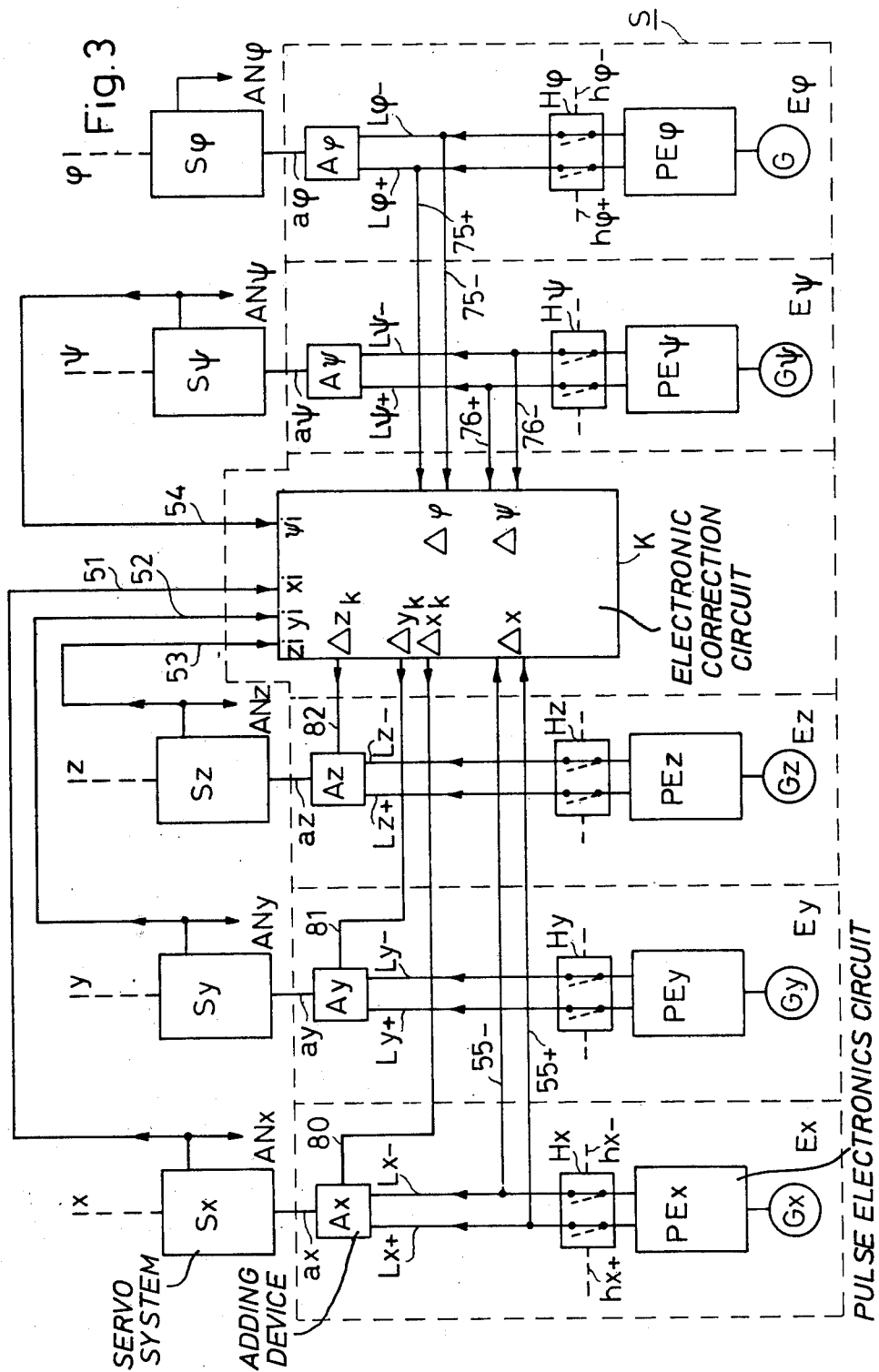
FIG. 3 is a schematic diagram of a control unit for an improved specimen holder constructed according to the present invention.

The control unit S for moving specimen 3 with three degrees of freedom of translation, i.e., in the x, y and z-axis directions, as well as with two degrees of freedom of rotation, i.e., tilting and rotational movement of the specimen through the angles $\psi$ and $\phi$, respectively, is schematically illustrated in FIG. 3. The specimen tilt angle $\psi$ has the value zero when specimen 3 is disposed perpendicular to the axis of the microscope, and the position of the specimen prior to rotation through the angle $\phi$ corresponds to a zero angle of rotation.

The control unit comprises an electronic correction circuit K, which is described later on herein with reference to FIG. 6, and adjustment devices Ex, Ey, Ez, E$\psi$, and E$\phi$ of identical design which generate at the outputs ax, ay, az, a$\psi$, and a$\phi$, positioning pulses for effecting both a stepwise displacement of the specimen by the linear increments $\Delta x$, $\Delta y$, and $\Delta z$ in the direction of one of the coordinate axes x, y and z, and a stepwise rotation of the specimen through the incremental angles $\Delta \psi$ and $\Delta \phi$ which are chosen small so that the movement of specimen 3 corresponding to these angular increments may be considered to be linear.

Figure 4:
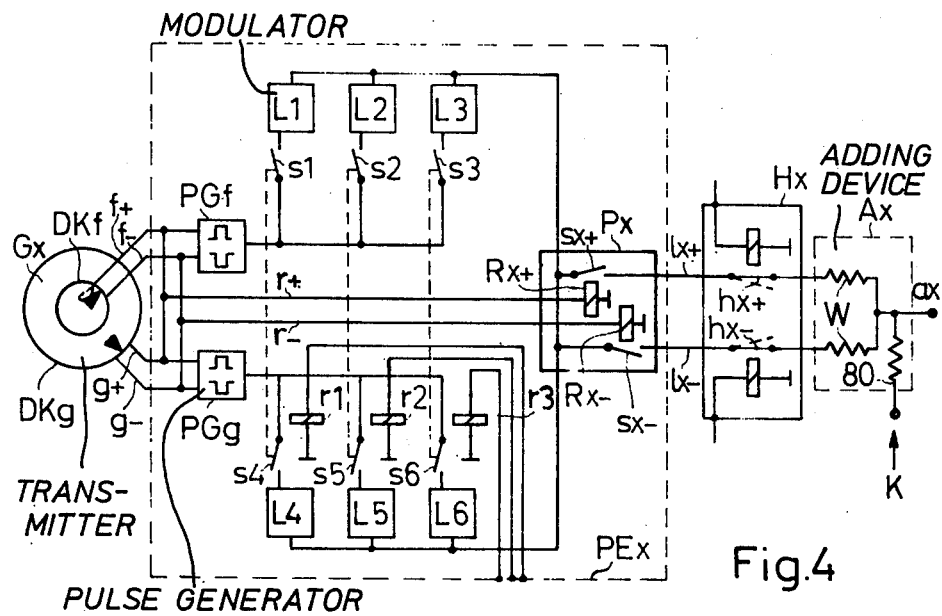
FIG. 4 is a schematic diagram of a specimen position adjustment device for an improved specimen holder constructed according to the present invention.

The design of adjustment devices Ex, Ey, Ez, E$\psi$ and E$\phi$ will be described with reference to the adjustment device Ex illustrated in FIG. 4. The adjustment device Ex enables a fine and coarse adjustment of the specimen position to be effected in both positive and negative directions and comprises a transmitter Gx, pulse electronics circuit PEx coupled to the transmitter, an auxiliary switch Hx, described below, coupled to the pulse electronics, and an adding device Ax coupled to switch Hx. Transmitter Gx controls pulse electronics circuit PEx and comprises a switch having two control knobs DKf and DKg which are coupled to pulse generators PGf and PGg by transmission lines f+ and f− and g+ and g−, respectively. The pulse generators generate a pulse of positive polarity which causes forward movement of the specimen when an electrical signal is transmitted from transmitter Gx to the generators through line f+ or g+, and a pulse of negative polarity which causes a backward movement of the specimen when an electrical signal is transmitted from transmitter Gx to the generators through line f− or g−.

The output pulses generated by the pulse generators are modulated in accordance with the magnification of the microscope. In the embodiment of the invention illustrated, three types of modulation are utilized in accordance with three predetermined magnification ranges of the microscope and each of the pulse generators is coupled to one of two groups of pulse width modulators L1, L2 and L3, and L4, L5 and L6, which are switched in accordance with the magnification. Modulators L1 to L6 amplify the width of the pulses by a factor of 1, 4, 8, 16, 64 and 128, respectively. Modulators L1 and L4, L2 and L5, and L3 and L6 are switched synchronously by means of relays r1, r2, and r3 including make contacts s1, s2, s3, s4, s5 and s6. Relays r1, r2 and r3 are energized when the magnification of the microscope is a maximum, medium or minimum magnification range. This assures that the displacement increments of the specimen become smaller as the magnification of the microscope becomes higher.

The pulses generated by pulse width modulators L1-L6 are transmitted through a polarity selector Px to switch Hx and adding device Ax by means of either transmission line 1x+ or 1x−, depending upon the polarity of the pulses. The pulses are transmitted by electrical resistors W of equal resistance to the output terminal ax of the adjustment device Ex. The polarity selector Px comprises a pair of relays Rx+ and Rx−, the excitation lines r+ and r− of which are connected to transmission lines f+ and g+ and f− and g−, respectively. These relays control make contacts sx+ and sx− coupled between pulse width modulators L1, L2 and L3 and L4, L5 and L6 and transmission lines 1x+ and 1x−.

The operation of adjustment device Ex is as follows:

The magnification of the microscope is assumed to be in a medium magnification range. The make contacts s2 and s5 are, thus, disposed in their closed positions. In order to effect a fine displacement of the specimen in a forward direction, control knob DKf of transmitter Gx is moved from a rest position into the position shown in FIG. 4 of the drawings. The transmitter then transmits a signal to pulse generator PGf through transmission line f+. In response to the signal, the generator generates a pulse of positive polarity which is amplified in width by pulse width modulator L2 by a factor of 4. The output pulse generated by modulator L2 is transmitted to the output terminal ax by transmission line 1x+ in which make contact sx+ is disposed in its closed position. It should be noted that the transmitter may include a rotary pulse generator switch such as that used as an incremental transmitter in machine tools, instead of the switch shown in the drawings comprising knobs DKf and DKg.

Figure 5:
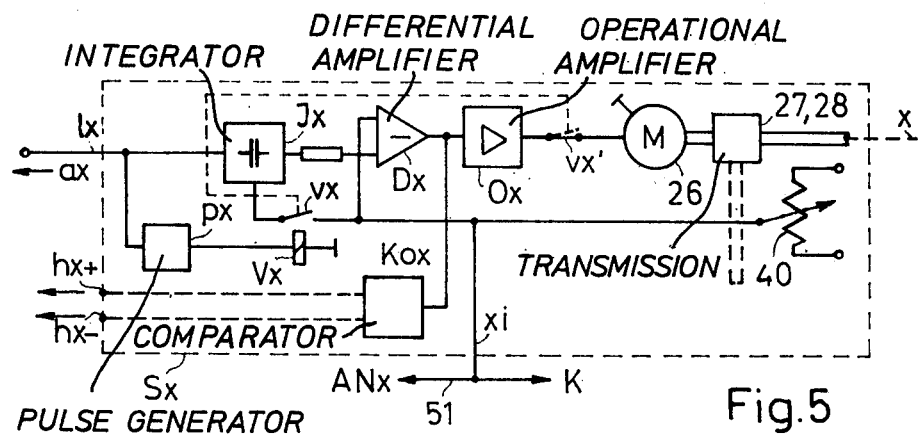
FIG. 5 is a schematic diagram of a servo system for an improved specimen holder constructed according to the present invention.

The pulses transmitted to adjustment devices Ex−Eϕ for moving the specimen in incremental steps forward and backward are transmitted to servo systems, Sx, Sy, Sz, Sψ, and Sϕ of identical design which are illustrated in FIG. 5 of the drawings with reference to servo system Sx. The servo system comprises an integrator Lx, a differential amplifier Dx coupled to the integrator, an operational amplifier Ox coupled to amplifier Dx and a motor, coupled to amplifier Ox, which moves the specimen by means of a transmission coupled to the motor. In FIG. 2, the motor and transmission of the servo system comprise motor 26 and bushing 27 and spindle 28. The servo system also includes a rotary potentiometer 40 which is the actual-value transducer for the x-coordinate of the specimen. The output signal generated by rotary potentiometer 40 is transmitted to differential amplifier Dx, an indicating device (not shown) for the specimen x-axis coordinate, and electronic correction circuit K.

The operation of servo system Sx is as follows:

Integrator Lx functions as a setpoint transmitter and transmits a voltage signal corresponding to the desired value xs of the specimen x-axis coordinate to differential amplifier Dx. The actual value xi of the specimen x-axis coordinate is also transmitted to amplifier Dx. If the desired value xs and the actual value xi are not the same, differential amplifier Dx generates an output voltage signal which is different from zero. Operational amplifier Ox then drives motor 26 until the actual and the setpoint values are the same, i.e., the same voltage is present at the two input terminals of differential amplifier Dx, in which case amplifier Dx generates a zero output signal.

Servo system Sx inlcudes a switchable contact vx coupled between integrator Lx and rotary potentiometer 40. Contact vx is a break contact of a relay Vx. During a rest period, i.e., when the specimen is not being moved, contact Vx is in its closed position. The desired value xs is, thus, always set at the actual value xi. This prevents a discharge of integrator Lx and an undesired change in the desired value xs coupled thereto. If the specimen is now moved in the x-axis direction, i.e., if a positioning pulse is transmitted to integrator Lx through input transmission line lx, relay Vx is energized by a pulse generator px during its delay time and contact vx is opened. The actual value xi of the specimen position may now be changed. The delay time of pulse generator px is chosen longer than the time required for the conversion of the positioning pulse into a stepwise motion of the specimen.

Servo system Sx also includes a switchable contact vx' coupled between operational amplifier Ox and motor 26 and opposite with respect to contact vx. Contact vx' provides additional assurance that the position of the specimen during a rest period is not affected by external influences such as a discharge of integrator Lx, and changes in the output power of differential amplifier Dx or operational amplifier Ox due to internal temperature response effects.

Adjustment devices Ex-Eϕ include auxiliary switches Hx, Hy, Hz, Hψ and Hϕ (shown in FIG. 3) each having two break contacts coupled between electronic pulse circuits PEx-PEϕ and adding devices Ax-Aϕ. These auxiliary switches interrupt the input to the integrators of the servo system whenever there is an excessively rapid change in a setpoint value for a time which is long enough to permit the actual value to approach the setpoint value. In servo system Sx, for example, if positioning and correction pulses x and $x_k$ are generated too closely to each other, i.e., if a displacement of the specimen in the x-axis direction is not completed prior to the generation of the next positioning or correction pulse at the input to integrator Lx, then break contacts hx+ and hx− of auxiliary switch Hx are actuated by a comparator Kox, coupled to the output terminal of differential amplifier Dx, which compares the absolute value of the output signal generated by amplifier Dx with a predetermined reference voltage value and energizes relays coupled to break contacts hx+ and hx− when the output signal generated by differential amplifier Dx is larger or equal in magnitude to the predetermined reference voltage. If the output signal of amplifier Dx is less than the reference voltage, i.e., if movement of the specimen is almost completed and actual value xi is near the setpoint value xs, the relays coupled to the break contacts close the contacts and variation of the setpoint value xs is possible again. It should be noted here that comparator Kox protects against the generation of excessively large incremental step widths for which the output signal generated by amplifier Dx is also greater than a predetermined value. In addition, the input to integrator Lx is interrupted to assure that too large a positioning step is not effected.

Whenever a defined movement of the specimen occurs, the viewed specimen point wanders from the point of incidence of the electron beam of the microscope. In addition, the position of the specimen point relative to the focal point of the objective lens of the microscope can change when the specimen is tilted or rotated or, if the specimen is tilted, the specimen is moved in the x-axis direction. The image of the fluorescent screen of the microscope, as a result, no longer displays the same specimen segment as previously and the sharpness of its image changes. To avoid such undesirable phenomena, control unit S is equipped with electronic correction circuit K which causes a corrective motion of the specimen prior to the next stepwise specimen movement.

Figure 6:
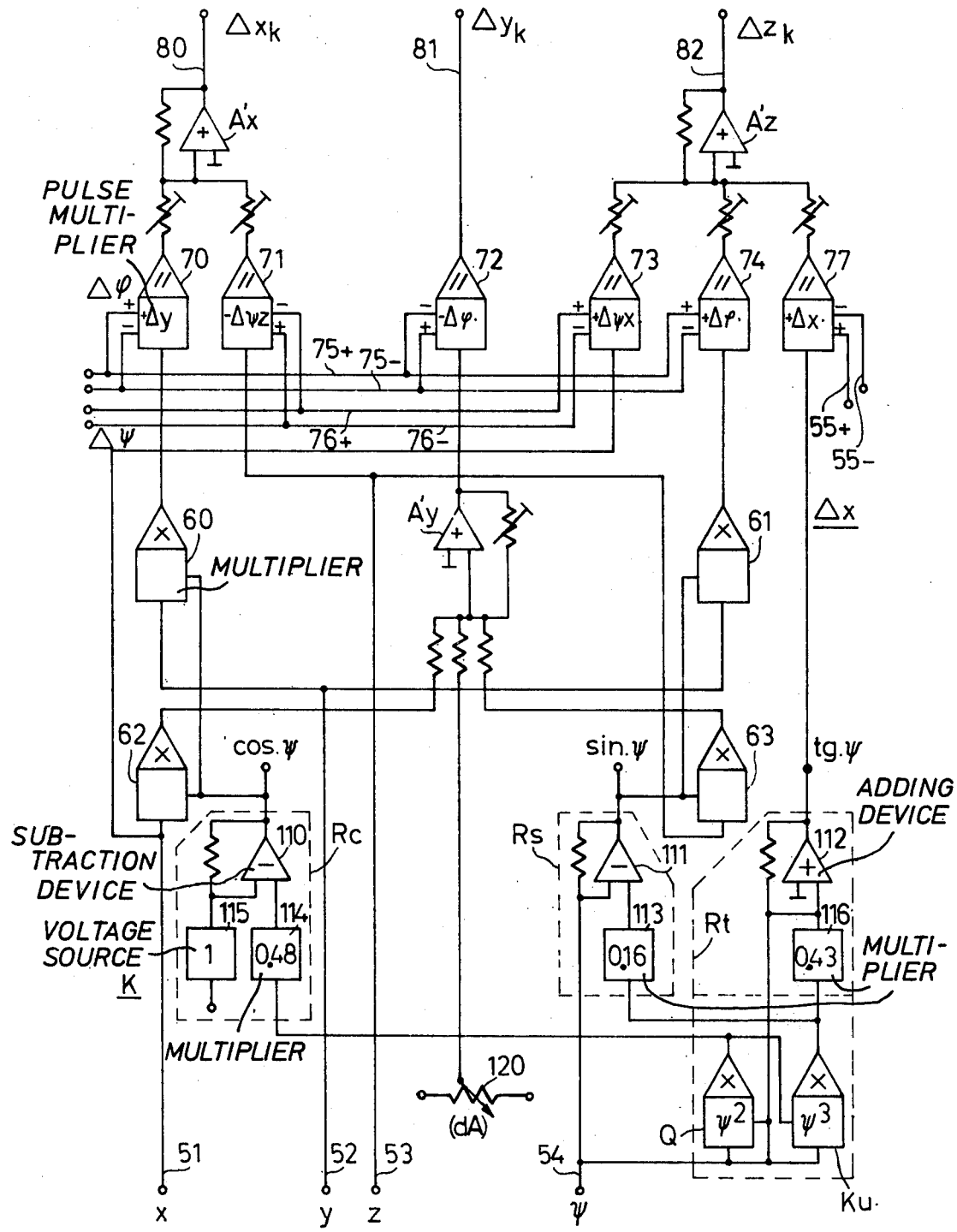
FIG. 6 is a schematic diagram of an electronic correction circuit for a tilt-rotation goniometer of an improved specimen holder constructed to the present invention.

The electronic correction circuit K, which is schematically illustrated in FIG. 3, for tilt-rotation goniometer G shown in FIG. 2, is illustrated in FIG. 6. The circuit comprises multipliers 60, 61, 62 and 63 and pulse multipliers 70, 71, 72, 73, 74 and 77, electrically connected as illustrated. The actual values $xi$, $yi$, $zi$, and $\psi i$ of the translational coordinates $x$, $y$ and $z$ and the tilt angle $\psi$ are transmitted to the correction circuit by transmission lines 51–54 (shown in FIG. 3), and the pulses for tilting and rotating the specimen through angular increments $\Delta\psi$ and $\Delta\phi$ and for moving the specimen in linear incremental steps $\Delta x$ according to their polarity are transmitted to circuit K by transmission lines 75+, 75−, 76+, 76−, 55+ and 55−. (The plus signs of each line symbolize forward movement of the specimen and the minus signs a backward movement of the specimen.)

The electronic circuit also includes computers Rs, Rc, and Rt to which the actual value $\psi i$ of tilt angle $\psi$ is transmitted. The computers generate the trigonometric functions of sine, cosine and tangent of the tilt angle. These trigonometric functions can be represented in angular range lying between ±45° with sufficient accuracy by the following equation approximations:

$$\sin(\psi) = \psi - 0.16 \cdot \psi^3 \qquad (7)$$

$$\cos(\psi) = 1 - 0.48 \cdot \psi^2 \qquad (8)$$

$$\tan(\psi) = \psi + 0.43 \cdot \psi^3 \qquad (9)$$

The angle is present in arc measure. In accordance with equations (7) to (9), the electronic correction circuit K includes multipliers Q and Ku which are connected to input transmission line 54 for the actual value of the tilt angle $\psi$. Multiplier Q calculates the square, and multiplier Ku the third power, of tilt angle $\psi$. In order to calculate the sine of tilt angle $\psi$, the output of multiplier Ku is multiplier by 0.16 by another multiplier 113 and is translated to the subtraction input terminal of a subtraction device 111. The other input terminal of the multiplier is directly connected to transmission line 54. A voltage signal is generated at the output terminal of this multiplier which corresponds to the size of tilt angle $\psi$.

Computer Rc is of the same design as computer Rs and comprises a subtraction device 110. The output signal generated by multiplier Q is multiplied by the factor 0.48 by a multiplier 114 and is transmitted to the subtraction input of subtraction device 110. A unit voltage is present at the other input terminal to subtraction device 110 which is generated by a voltage source 115.

Computer Rt for generating the tangent of tilt angle $\psi$ comprises an adding member 112 to which a voltage signal corresponding to tilt angle $\psi$ and the output signal of multiplier Ku, multiplied by the factor 0.43 by a multiplier 116, is transmitted. A voltage signal corresponding to the tangent of the tilt angle is present at the output terminal summing device 117.

The operation of the electronic correction circuit will first be described with reference to a forward rotation of the specimen through the angular increment $\Delta\phi$. The angular increment or step $\Delta\phi$ requires a correctional movement of the specimen to be made in the x-axis direction through the step $\Delta x_k = \Delta\phi \cdot \cos\psi$ (see equation 4.) To achieve this, the pulse corresponding to angular increment $\Delta\phi$ is transmitted to pulse multiplier 70 by transmission line 75+. A voltage signal which is proportional to $y \cdot \cos\psi$ is also transmitted to the multi-plier 70 by transmitting the actual value of the y-axis coordinate and the cosine of tilt angle $\psi$ to multiplier member 60. Pulse multiplier 70 then generates a voltage pulse which corresponds to $\Delta\phi \cdot y \cdot \cos\psi$ and is transmitted to an adding device $Ax'$, the output signal of which is transmitted by a transmission line 80 to adding device Ax and to the integrator of servo system Sx. Servo system Sx then changes the position of the specimen by the increment $\Delta x_k$.

The correction of the y-axis coordinate corresponding to the incremental angle of rotation $\Delta\phi$ by the value $\Delta y_k = - \Delta\phi \cdot (x \cdot \cos\psi + \cdot \sin\psi)$ (see equation 5) is effected in a similar manner. In order to achieve this, the pulse corresponding to angular increment $\Delta\phi$ is transmitted to pulse multiplier 72 which is responsive to a voltage corresponding to $x \cdot \cos\psi + z \cdot \sin\psi$ which is generated by multipliers 62 and 63. The actual value of the x-axis coordinate and the cosine of the tilt angle $\psi$ is transmitted to multiplier 62, and the actual value of the z-axis coordinate and the sine of tilt angle $\psi$ is transmitted to multiplier 63. The output signals of multipliers 62 and 63 are transmitted to a summing device $Ay'$, the output terminal of which is connected to pulse multiplier 72 which generates a correction pulse of the increment $\Delta y_k$ and transmits the pulse to adding device Ay and servo system Sy by transmission line 81 to effect the y-axis displacement.

In order to prevent variation of the sharpness of the microscope image in the event of a rotation of the specimen through the angle $\Delta\phi$, the specimen is moved through a correction increment $\Delta z_k$ effected in the z-axis direction of the magnitude $\Delta\phi \cdot y \cdot \sin\psi$ (see equation 6). In order to achieve this, the pulse generated for rotation angle $\Delta\phi$ is transmitted to pulse multiplier 74 at which a voltage is present which is proportional to $y \cdot \sin\psi$ and is generated by multiplier 61. The output of pulse multiplier 74 is transmitted to adding device $Az'$ which is coupled by transmission line 82 to adding device Az ahead of servo system Sz which effects z-axis displacement of the specimen and moves the specimen through the increment $\Delta z_k$.

If the specimen is tilted through the angle $\Delta\psi$, corrective movements in the x and z-axis directions are carried out in accordance with equations (4) – (6) above. To effect correction in the x-axis direction, a voltage signal which is proportional to $-\Delta\psi \cdot z$ is transmitted to adding device $Ax'$. This voltage is generated by pulse multiplier 71, to which the instantaneous value of the specimen z-axis coordinate and the pulse for effecting tilting through the angle $\Delta\psi$ are transmitted. To effect the specimen correction in the z-axis direction, a signal is transmitted to adding device Az which corresponds to $\Delta\psi \cdot x$. This signal is generated by pulse multiplier 73 to which the pulse for changing the angle by the angular increment $\Delta\psi$ and a voltage corresponding to the actual value xi are transmitted.

If the tilted specimen is moved in the x-axis direction through the increment $\Delta x$, the sharpness of the image of the microscope will change, as previously stated. The point of incidence of microscope beam, in this situation, no longer lies in the plane of the specimen (which is assumed to be planar). In order to avoid such variations of the sharpness of the image, a pulse multiplier 77 is provided in correction circuit K to which a pulse for the translational movement $\Delta x$ and the tangent of tilt angle $\psi$ are transmitted. The output signal generated by pulse multiplier 77 is transmitted to summing member $\Delta z'$, and the correction circuit causes a translational movement of the specimen in the z-axis direction through the increment $\Delta x \cdot \tan \psi$ and compensates for the image sharpness change caused by the translational movement $\Delta x$.

It frequently happens that the tilt axis 14 (see FIG. 2) does not intersect the axis of rotation of the specimen (in FIG. 2, the axis of rotation is perpendicular to the turntable 2). The deviation of the two axes can be compensated for by incorporating an additional term into the correction step for the y-axis direction (see equation 5) corresponding to $-\Delta\phi \cdot dA$, where $dA$ is equal to the distance of the axes from each other. This term is generated in correction circuit K by means of an adjustable resistor 120 at which a constant voltage is present and which is connected to adding device $A y'$.

Figure 7:
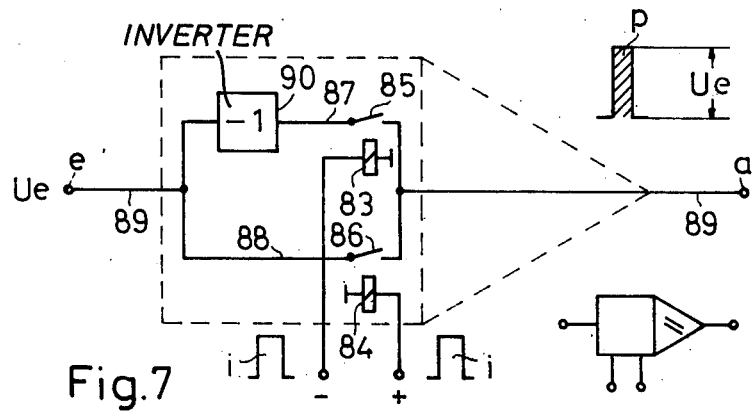
FIG. 7 is a schematic diagram of a pulse multiplier for the electronic correction circuit illustrated in FIG. 6.

A pulse multiplier of the type used in correction circuit K (circuit elements 70–74, and 77) is illustrated in FIG. 7. The multiplier comprises a pair of relays 83 and 84 which actuate make contacts 85 and 86 in electrical transmission lines 87 and 88. Lines 87 and 88 are branches of another transmission line 89 which couples input terminal e to output terminal a of the pulse multiplier. An inverter 90 is coupled to contact 87 in transmission line 87.

The multiplier generates a pulse $p$ having a width and amplitude which can be varied. The width of pulse $p$ is determined by the length $\tau$ of a pulse $i$ which is transmitted to relay 83 or relay 84, respectively. The amplitude of pulse $p$ is fixed by the magnitude of the voltage Ue present at the input terminal $e$; pulse $p$ has a pulse area $Ue \cdot \tau$ at the output terminal $a$. The polarity of pulse $p$ is positive if the pulse $i$ is transmitted to relay 84 and negative if the pulse is transmitted to relay 83.

The operation of the pulse multiplier of FIG. 7 will now be described with reference to the following two examples:

Considering first pulse multiplier 70 (see FIG. 6), the execution of an angular step $\pm\Delta\phi$ is achieved by transmission of a correction pulse of the magnitude $\pm\Delta\phi \cdot y \cdot \cos \psi$ by multiplier 70. The voltage corresponding to $y \cdot \cos \psi$ is present at the input terminal of the multiplier and is generated by multiplier 60. The pulse corresponding to angular increment step $\pm\Delta\phi$ is transmitted to a relay corresponding to one of the relays 83 and 84 in pulse multiplier 70. The described correction pulse is then generated at the output of the multiplier.

To effect an angular increment or step of the magnitude $\pm\Delta\psi$, pulse multiplier 71 generates a correction pulse of the magnitude $(\mp)z \cdot \Delta\psi$. To achieve this, the voltage corresponding to the actual value of the specimen z-axis coordinate is transmitted, as shown in FIG. 6, to the input of the multiplier, and a pulse corresponding to the angular increment $(\pm) \Delta\psi$ is transmitted to a relay corresponding to relays 83 and 84 (see FIG. 7) in pulse multiplier 71. A correction pulse having a magnitude $(\mp) z \cdot \Delta\psi$ is then generated at the output terminal of pulse multiplier 71.

Figure 8:
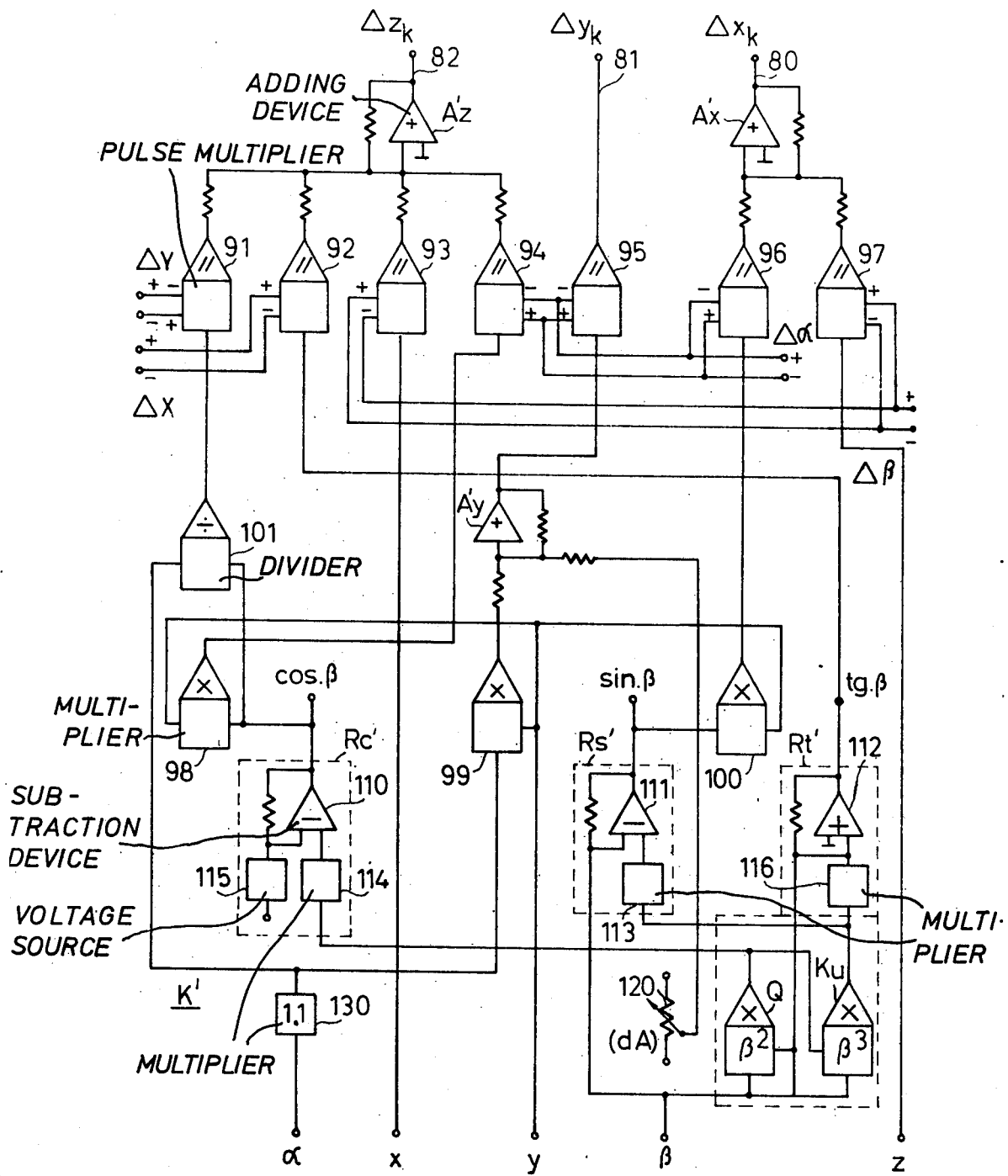
FIG. 8 is a schematic diagram of another electronic correction circuit for a double-tilt goniometer of an improved specimen holder constructed according to the present invention.

An electronic correction circuit K' for a double-tilt goniometer, which corresponds to the correction circuit K illustrated in FIG. 6, is illustrated in FIG. 8. The control unit of circuit K' is similar in design to the control unit shown in FIG. 3 and includes adjustment devices for moving the specimen in the x, y and z-axis directions in incremental step widths $\Delta x$, $\Delta y$, and $\Delta z$ and for tilting the specimen in angular increments $\alpha x$ and $\Delta\beta$. The pulses generated for moving the specimen are transmitted to servo systems associated with the adjusting devices and corresponding to the servo systems $Sx$-$S\phi$ illustrated in FIG. 3.

Correction circuit K' comprises pulse multipliers 91, 92, 93, 94, 95, 96 and 97, multipliers 98, 99, and 100, and divider 101. The input variables to circuit K' are the actual values of the x, y, and z-axis coordinates, the tilt angles $\alpha$ and $\beta$, and the pulses for the stepwise increments $\Delta x$, $\Delta y$, $\Delta\alpha$, and $\Delta\beta$.

The circuit also includes computers Rs', Rc', and Rt' which correspond to the computers shown in FIG. 3 and form the trigonometric functions sine, cosine and tangent of tilt angle $\Delta$. The tangent of the tilt angle $\alpha$ in equations (1) –(3) above is approximated by $1.1 \alpha$. To achieve this, the angle $\alpha$ is transmitted to correction circuit K' through a multiplier 130. This assumption is sufficiently accurate to be valid in an angular range of the angle $\alpha$ of $\pm 45°$.

The operation of the circuit shown in FIG. 8 is as follows:

If the specimen is tilted through the angle $\Delta\alpha$, pulse multiplier 96 causes a correction step $\Delta x_k$ in the x-axis direction of the magnitude $-\Delta\alpha \cdot y \cdot \sin \beta$, pulse multiplier 95 causes a correction step $\Delta y_k$ in the y-axis direction of the magnitude $-\Delta\alpha \cdot y \cdot 1.1 \cdot \alpha$, and pulse multiplier 94 causes a correction step $\Delta z_{k = -\Delta\alpha} \cdot y \cdot \cos \beta$ in the z-axis direction (see equations (1) –(3) above).

To cause tilting movement of the specimen through the angle $\beta$, incremental correction steps are generated in the x and z-axis direction. The incremental step $\Delta x_k$ in the x-axis direction is equal to $\Delta\beta \cdot z$ and is present at the output of pulse multiplier 97. The incremental step $\Delta z_k$ in the z-axis direction has a magnitude of $-\Delta\beta \cdot x$ and is generated by pulse multiplier 93.

The specimen area examined can also wander away from the point of incidence of the electron beam in a double-tilt goniometer when a translational step movement occurs and, thus, disappear from the field of view of the microscope. In addition, the sharpness of the microscope image can change. To avoid such phenomena, pulse multiplier 92 generates as an incremental translational step $\Delta x$ the correction step $\Delta z_k$ of $\Delta x \cdot \tan \beta$, and the pulse multiplier 91 generates as an incremental translational step $\Delta y$ a correction step $\Delta z_k$ in the z-axis direction. This latter correction step is equal to $-y \cdot 1.1 \cdot \alpha/\cos \beta$.

To compensate for an offset of the axes, i.e., a nonexistant intersection of the axes of rotation for the tilt angles $\alpha$ and $\beta$, a correction device 120, specifically a variable resistor, corresponding to that shown in FIG. 6, is provided. In conjunction with pulse multiplier 95, resistor 120 causes a correction step $\Delta y_k$ in the y-axis direction of the magnitude $-\Delta\alpha \cdot dA$, $dA$ being the distance of the two axes from each other. The correction steps are transmitted to a control unit (not shown) which is designed in the same manner as that shown in FIG. 3 and enables a stepwise displacement of the specimen in the x, y, and z-axis directions and tilting of the specimen through the angles $\alpha$ and $\beta$ to be effected.

It should be noted that although the invention has been described with reference to an electron microscope, it can also be utilized in electron and ion optical irradiation equipment.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. In a corpuscular-beam apparatus including a specimen holder having at least two degrees of freedom of translation and at least one degree of freedom of rotation, and control means for correcting the translational coordinates of the specimen holder automatically when the specimen holder is rotated and retaining a predetermined specimen point in its position in the apparatus, the improvement comprising said control means comprising, means for controlling the rotational movement of said specimen holder stepwise in angular increments, said angular increments being chosen small so that the translational movement of the specimen point for each angular increment may be considered linear, and means for correcting the translational coordinates of the specimen holder stepwise in linear increments prior to each stepwise rotation of said specimen holder, each of said linear increments comprising a linear function of the instantaneous values of said translational coordinates and of said angular increments of said rotational movement of said specimen holder.

2. The apparatus recited in claim 1, further comprising a servo system coupled to said control means and said specimen holder, said servo system comprising a setpoint transmitter, a control amplifier coupled to said transmitter, a d-c motor coupled to said amplifier, and an actual-value transducer, coupled to said control amplifer, for transmitting the actual coordinates of the specimen holder to said control amplifier.

3. The apparatus recited in claim 2, wherein said setpoint transmitter comprises an integrator for storing the setpoint coordinates.

4. The apparatus recited in claim 3, further comprising switch means, coupled between said actual-value transducer and said integrator, for setting the content of said integrator at the output level of said actual-value transducer.

5. The apparatus recited in claim 2, further comprising means for disabling said control means when a predetermined difference between the setpoint value and the actual value is exceeded.

6. The apparatus recited in claim 1, wherein said angular and linear increments are a function of the magnification of the corpuscular-beam apparatus.

* * * * *